US012680869B2

(12) United States Patent
Paul et al.

(10) Patent No.: US 12,680,869 B2
(45) Date of Patent: Jul. 14, 2026

(54) IN-SITU REFLECTOMETRY FOR REAL-TIME SELECTIVITY MONITORING

(71) Applicant: Applied Materials, Inc., Santa Clara, CA (US)

(72) Inventors: Khokan C. Paul, Cupertino, CA (US); Tao Sheng, Santa Clara, CA (US); Qing Hong, Santa Clara, CA (US); Vinh N. Tran, San Jose, CA (US); Zhepeng Cong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 18/740,350

(22) Filed: Jun. 11, 2024

(65) Prior Publication Data

US 2025/0251280 A1      Aug. 7, 2025

Related U.S. Application Data

(60) Provisional application No. 63/550,185, filed on Feb. 6, 2024.

(51) Int. Cl.
    *G01J 3/30*     (2006.01)
    *G01J 3/02*     (2006.01)
    *H10P 74/20*     (2026.01)

(52) U.S. Cl.
    CPC .............. *G01J 3/0208* (2013.01); *G01J 3/30* (2013.01); *H10P 74/203* (2026.01)

(58) Field of Classification Search
    CPC ....... G01B 11/06; H01L 21/20; H01L 21/461; H01L 21/02293; H01L 22/12; G01J 3/0208; G01J 3/30
    See application file for complete search history.

(56) References Cited

U.S. PATENT DOCUMENTS

| | | | | |
|---|---|---|---|---|
| 5,164,040 A | * | 11/1992 | Eres | C30B 25/14 |
| | | | | 117/936 |
| 5,724,145 A | * | 3/1998 | Kondo | G01B 11/0625 |
| | | | | 250/559.28 |
| 6,019,839 A | * | 2/2000 | Achutharaman | C30B 25/02 |
| | | | | 117/88 |
| 6,679,946 B1 | * | 1/2004 | Jackson | C30B 25/16 |
| | | | | 117/85 |
| 7,402,207 B1 | * | 7/2008 | Besser | H01L 21/67745 |
| | | | | 117/85 |

(Continued)

OTHER PUBLICATIONS

International Search Report and Written Opinion dated Apr. 24, 2025 for Application No. PCT/US2025/012556.

*Primary Examiner* — Abdullahi Nur
(74) *Attorney, Agent, or Firm* — Patterson + Sheridan, LLP

(57) ABSTRACT

In one implementation, a method of monitoring film selectivity on a substrate, comprises: generating light from a light source; collimating the light from the light source to form a collimated beam; reflecting the collimated beam off of a surface to be measured to produce a reflected beam; splitting the reflected beam with a dichroic mirror, wherein the reflected beam splits into a first beam and a second beam; receiving, by a pyrometer, the first beam from the dichroic mirror; receiving, by a spectrometer, the second beam from the dichroic mirror; and analyzing data derived from the pyrometer and the spectrometer to determine the film selectivity the surface to be measured.

18 Claims, 11 Drawing Sheets

(56)                     References Cited

U.S. PATENT DOCUMENTS

| | | | |
|---|---|---|---|
| 10,923,394 B2 | 2/2021 | Clark et al. | |
| 11,257,671 B2 * | 2/2022 | Chen | H01L 21/67115 |
| 2004/0087041 A1 * | 5/2004 | Perry | G01B 11/0616 |
| | | | 438/5 |
| 2006/0141795 A1 * | 6/2006 | Negishi | H01L 22/12 |
| | | | 257/E21.252 |
| 2012/0293813 A1 | 11/2012 | Rehder et al. | |
| 2018/0010243 A1 | 1/2018 | Lee et al. | |
| 2021/0138579 A1 | 5/2021 | Kanko et al. | |
| 2021/0308792 A1 | 10/2021 | Donadello et al. | |
| 2021/0391157 A1 | 12/2021 | Tae et al. | |
| 2022/0148862 A1 * | 5/2022 | Lian | H01J 37/32963 |
| 2023/0143766 A1 | 5/2023 | Atanackovic | |
| 2023/0197794 A1 | 6/2023 | Atanackovic | |
| 2024/0072206 A1 | 2/2024 | Atanackovic | |
| 2024/0142223 A1 * | 5/2024 | Paul | G01B 11/0625 |

* cited by examiner

500

502
ROTATE PEDESTAL

504
PROVIDE LIGHT TO SUBSTRATE

506
COLLECT DATA WHILE SIGNALING A
LIGHT SOURCE TO EMIT LIGHT

508
SPECTROMETER SENDS DATA
TO THE CONTROLLER

510
ASSOCIATE ANGULAR POSITION WITH
SPECTROMETER DATA

512
STORE DATA AS REFERENCE

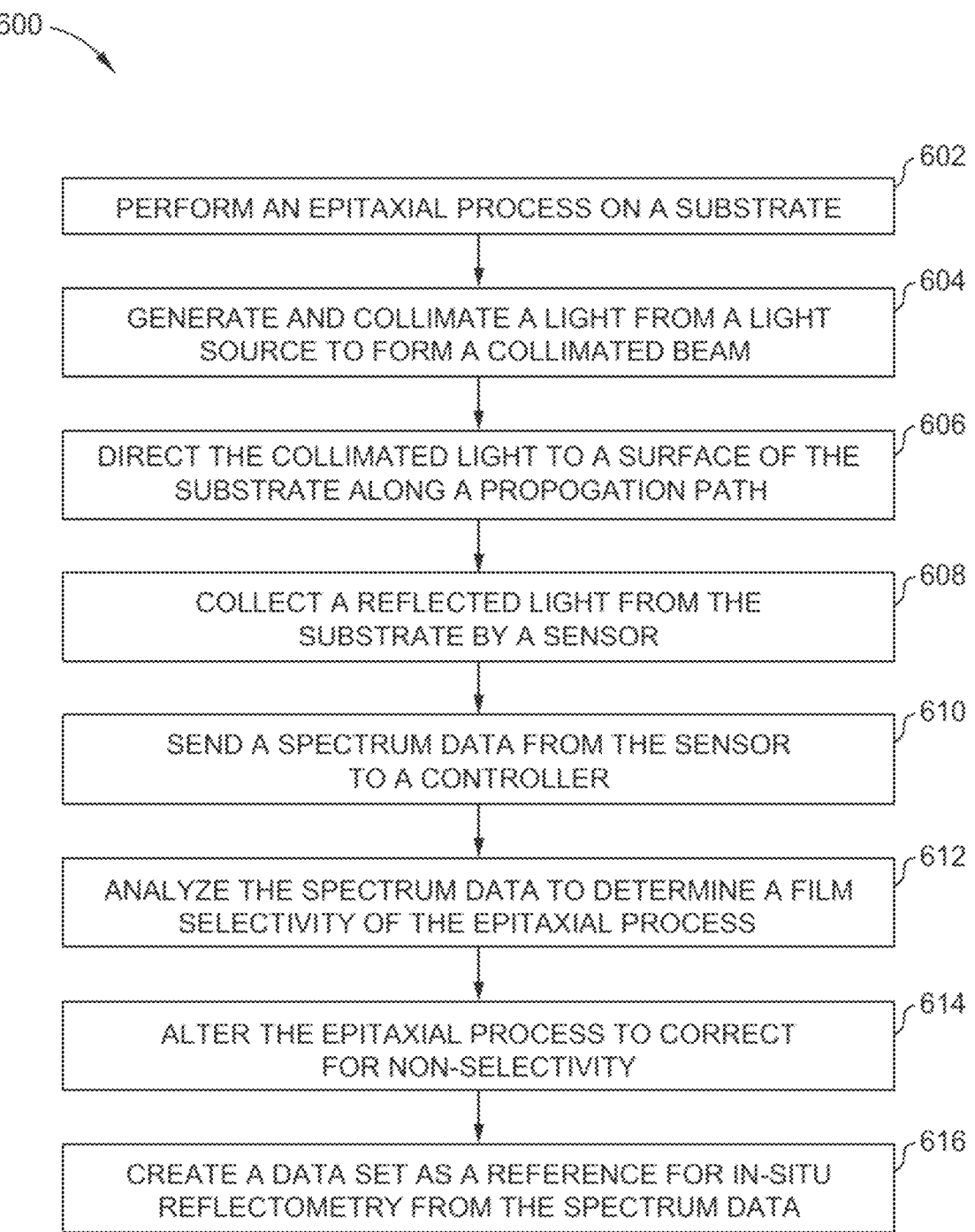

600

602 — PERFORM AN EPITAXIAL PROCESS ON A SUBSTRATE

604 — GENERATE AND COLLIMATE A LIGHT FROM A LIGHT SOURCE TO FORM A COLLIMATED BEAM

606 — DIRECT THE COLLIMATED LIGHT TO A SURFACE OF THE SUBSTRATE ALONG A PROPOGATION PATH

608 — COLLECT A REFLECTED LIGHT FROM THE SUBSTRATE BY A SENSOR

610 — SEND A SPECTRUM DATA FROM THE SENSOR TO A CONTROLLER

612 — ANALYZE THE SPECTRUM DATA TO DETERMINE A FILM SELECTIVITY OF THE EPITAXIAL PROCESS

614 — ALTER THE EPITAXIAL PROCESS TO CORRECT FOR NON-SELECTIVITY

616 — CREATE A DATA SET AS A REFERENCE FOR IN-SITU REFLECTOMETRY FROM THE SPECTRUM DATA

FIG. 6

IN-SITU REFLECTOMETRY FOR REAL-TIME SELECTIVITY MONITORING

CROSS-REFERENCE TO RELATED APPLICATIONS

This application claims benefit of U.S. provisional patent application Ser. No. 63/550,185, filed Feb. 6, 2024, which is herein incorporated by reference.

BACKGROUND

Field

Embodiments of the present disclosure generally relate to a processing chamber with in-situ reflectometry for real-time process monitoring. In particular, the disclosure relates to in-situ reflectometry for real-time selectivity monitoring.

Description of the Related Art

Epitaxial processes for logic and memory applications, such as source and drain, require selectivity of an epitaxial process (e.g., deposition or etching) on portions of a substrate. Maintaining selectivity with high-dose dopants poses significant challenges and a significant amount of fabrication time in order to tune the process. Further, due to shifting conditions within the chamber, issues with yield may still persist.

Selectivity measurements of a processed substrate can be used in relation to processing operations. Generally, selectivity measurements are taken outside of a process chamber in which the substrate is processed, after the processing operations are conducted. Such measurements can introduce inefficiencies and reduce throughput, since substrates which do not meet specifications may be discarded, and several processing iterations may be necessary to obtain measurements that meet specifications.

Additionally, because processing equipment in the process chamber can interfere with measurement equipment, selectivity measurements can be difficult to conduct within the process chamber and during the processing operations, thereby hindering measurement accuracy. For example, heat emitted from heat lamps can interfere with measurement equipment. As another example, material may accumulate on windows of a processing chamber during processing, interfering with measurement accuracy.

Therefore, there is a need for improved apparatus, systems, and methods that facilitate in-situ and real-time film selectivity measurement operations.

SUMMARY

Embodiments of the present disclosure generally relate to apparatus, systems, and methods for real time in-situ reflectometry monitoring of semiconductor processing. A selectivity of a film on a substrate is monitored during a substrate processing operation that forms the film on the substrate. The selectivity is monitored while the substrate processing operation is conducted.

In one implementation, a method is disclosed. The method includes generating light from a light source. The light is collimated from the light source to form a collimated light beam. The collimated light beam is directed into a process chamber to a substrate surface during an epitaxial process. The collimated light beam is reflected off of the substrate surface to produce a reflected beam. The reflected beam is received by a spectrometer. Data derived from the spectrometer is analyzed to determine a film selectivity of the epitaxial process.

In another implementation, a processing chamber is disclosed. The processing chamber includes a susceptor assembly, an in-situ reflectometry (ISR) system, and a controller. The susceptor assembly is disposed in a processing volume of the processing chamber and is configured to support a substrate. The ISR system is configured to determine a film selectivity of an epitaxial process on a substrate. The ISR system includes a light source configured to direct a light to a substrate surface during an epitaxial process and a sensor configured to receive a reflected light and generate spectrum data based on the reflected light. The controller is configured to analyze the spectrum data to determine a film selectivity of the epitaxial process In yet another implementation, a method of determining a selectivity of a film formed on a substrate is disclosed. The method includes performing an epitaxial process and directing light from a light source towards a surface of the substrate along a propagation path. A reflected light is collected from the surface of the substrate. A spectrometer receives the reflected light. A spectrum data is generated based on the reflected light. A data set is created as a reference for in-situ reflectometry from the spectrum data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 6 is a schematic block diagram view of a method of monitoring film selectivity of an epitaxial process, according to one or more implementations.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to epitaxial chambers integrating in-situ reflectometry for real time process monitoring for use in process chambers, such as epitaxial chambers. Specifically, unlike chemical vapor deposition (CVD), metrology is not commonly used in epitaxial chambers due to the issues created by the directional cross-flows across the surface of a substrate during epitaxial processing. During processing, light from a substrate is monitored as a film is formed on the substrate. The light is collected and analyzed by a spectrometer, computing device, and/or other light measuring apparatuses to facilitate determination of substrate properties, such as film selectivity. Multiple measurements, for example, film selectivity, film thickness, film deposition/etching rate, and/or substrate temperature, can occur simultaneously using one or more measuring apparatuses.

Figure 1:
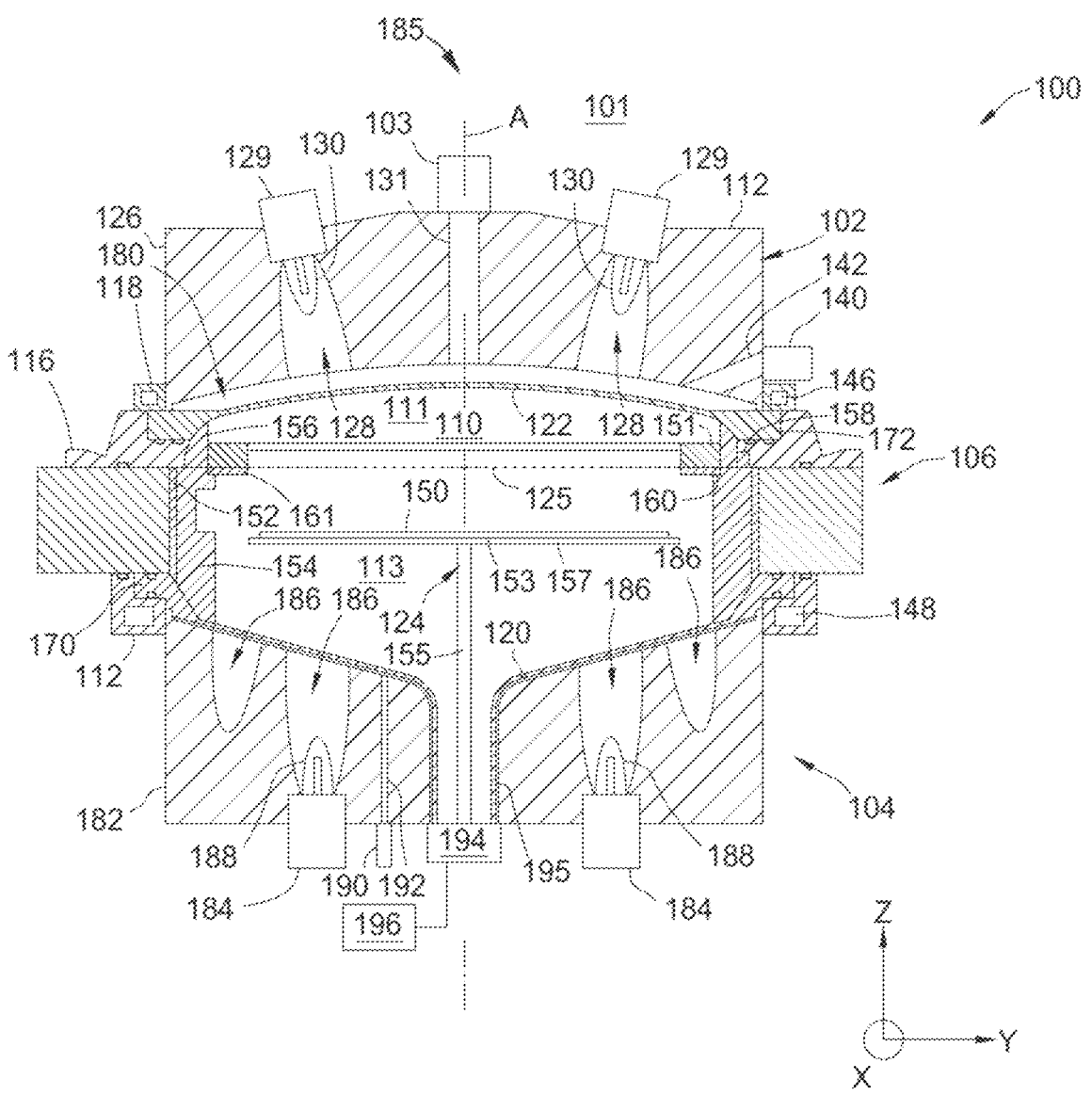
FIG. 1 is a schematic cross-sectional view of a system with an in-situ reflectometry system for processing substrates, according to one or more implementations.

FIG. 1 is a schematic cross-sectional view of a system 101 for processing substrates, according to one implementation. The system 101 includes a process chamber 100. The process chamber 100 may be an epitaxial process chamber and may be used as part of a cluster tool. The process chamber 100 is utilized to grow/deposit or etch an epitaxial film on a substrate, such as the substrate 150. The substrate 150 has a substrate surface upon which material is deposited or etched during an epitaxial process. The process chamber 100 creates a cross-flow of precursors (e.g., process gases) across the top surface of the substrate 150 during processing. The system 101 uses a process chamber 100 configured to conduct an epitaxial process operation on the substrate 150.

The process chamber 100 may also be used for selective epitaxial processing. N- and P-type source and drain epitaxy, as well as N- and P-type contact epitaxy, on patterned substrates 150 requires nodule-free processing for logic and memory applications. Nodule formation on a dielectric surface and/or CVD imperfections in the open silicon area may cause device failure. Due to the sensitivities of the structures, N- and P-type epitaxy may be prone to nodule formation in the dielectric region. The process chamber 100 enables increased selectivity (e.g., reduced nodule formation) during selective epitaxial processing due to real time monitoring and controlling of the selectivity of the epitaxy process. The real time monitoring of the selectivity of the epitaxy process further enables control of the processing conditions during the epitaxial processing and an increase in the fabrication throughput.

The aspects and benefits of the present disclosure can be used for other substrate processing operations, such as in chemical vapor deposition (CVD) chambers, atomic layer deposition (ALD) chambers, physical vapor deposition (PVD) chambers, etch chambers, ion implantation chambers, oxidation chambers, and/or other processing chambers.

The process chamber 100 includes an upper housing module 102, a lower housing module 104, a chamber body assembly 106, a susceptor assembly 124, a lower window 120, and an upper window 122. The upper housing module 102 can also be a lid or part of a process chamber lid. The susceptor assembly 124 is disposed between the upper housing module 102 and the lower housing module 104. The lower window 120 is disposed between the susceptor assembly 124 and the lower housing module 104. The upper window 122 is disposed between the susceptor assembly 124 and the upper housing module 102.

The upper housing module 102 is disposed over the susceptor assembly 124 and configured to heat a substrate, such as the substrate 150, disposed on the susceptor assembly 124. The upper housing module 102 includes an upper module body 126 and a plurality of lamp apertures 128 disposed through the upper module body 126. Each of the plurality of lamp apertures 128 includes an upper lamp 130 disposed therein. Each of the upper lamps 130 are coupled to a lamp base 129. Each of the lamp bases 129 supports one of the upper lamps 130 and electrically couples each of the upper lamps 130 to a power source (not shown). Each of the lamps 130 are secured in a generally vertical orientation within the lamp apertures 128. As described herein, the generally vertical orientation of the upper lamps 130 is approximately perpendicular to the substrate support surface of the susceptor assembly 124. However, other orientations are also contemplated. The vertical orientation of the upper lamps 130 may not necessarily be perpendicular to the substrate support surface, and may be at an angle of about 30° to about 150° with respect to a substrate support surface 153 of the susceptor assembly 124. The angle can be about 45° to about 135° with respect to the substrate support surface 153, such as an angle of about 70° to about 110° with respect to the substrate support surface 153.

The upper housing module 102 includes a pyrometer passage 131 (for example, a light pipe). The pyrometer passage 131 may be a centrally-located within the upper housing module 102. The upper housing module 102 may also include at least a preheat ring (PHR) 161, a PHR sensor 221, and a PHR sensor passage 219 (shown in FIGS. 2A and 2B) to measure film selectivity on a pre-selected coupon 151 (formed, for example, of SiN) on the PHR 161 that can provide reference information about the process on substrate 150. A similar sensor can be implemented to measure parameters at the substrate-edge, either in combination with a pyrometer for dome application, or without a pyrometer (not shown). The PHR sensor 221 allows for the use of a reflected signal from the PHR coupon 151, free of rotation or wobbling disturbances, since the PHR 161 is static. An established correlation between substrate and known PHR coupon 151 selectivity can be used for fabrication production-process control on multiple substrates, including unknown patterned substrates, by providing a reference of a known value.

The pyrometer passage 131 extends through the upper module body 126 from a first (e.g., lower) surface of the upper module body 114 to a second (e.g., upper) surface of the upper module body 126. The pyrometer passage 131 is configured to allow light to travel between the surface of the substrate 150 and an in-situ reflectometry (ISR) system 185.

The PHR sensor passage (shown in FIGS. 2A and 2B) 219 extends through the upper module body 126 from the first surface of the upper module body 114 to the second surface of the upper module body 126. The PHR sensor passage 219 is configured to allow light 229 to travel between the surface of the coupon 151 or substrate 150 surface and the ISR System 185. The reflected signal from the PHR-coupon 151 may also be directed and collected at right-angle or other adaptable angular orientation, based on the hardware integration suitability. The ISR system 185 includes a housing 103 that houses one or more optical elements therein to facilitate processing of optical signals.

An upper plenum 180 is defined between the bottom surface of the upper module body 126 and the upper window 122. Heated gas is supplied to the upper plenum 180. A heated gas exhaust passage 142 is also disposed through the upper module body 126. The heated gas exhaust passage 142 is coupled to a heated exhaust pump 140. The heated exhaust pump 140 removes gas from the upper plenum 180.

The lower housing module 104 is disposed below the susceptor assembly 124 and configured to heat a bottom side of the substrate 150 disposed on the susceptor assembly 124. The lower housing module 104 includes a lower module body 182 and a plurality of lamp apertures 186 disposed through the lower module body 182. Each of the plurality of lamp apertures 186 includes a lower lamp 188 disposed therein. Each of the lower lamps 188 are disposed in a generally vertical orientation and coupled to a lamp base 184. Each of the lamp bases 184 supports one of the lower lamps 188 and electrically couples each of the lower lamps 188 to a power source. As described herein, the generally vertical orientation of the lower lamps 188 is described with respect to the substrate support surface 153 of the susceptor assembly 124. It is contemplated that the lamp orientation may be other than generally vertical, such as at an angle of about 30° to about 150° with respect to the substrate support surface 153. The angle can be about 45° to about 135° with respect to the substrate support surface 153, such as about 70° to about 110° with respect to the substrate support surface 153.

During the substrate processing operation, the upper lamps 130 are powered to generate radiant energy (e.g. heat) and direct the radiant energy toward the substrate 150 and the susceptor 157. During the substrate processing operation, the lower lamps 188 are powered to generate radiant energy upwardly toward the substrate 150 and the susceptor 157.

The lower housing module 104 includes a susceptor shaft passage 195 and a pyrometer passage 192. A support shaft 155 of the susceptor assembly 124 is disposed through the susceptor shaft passage 195. The susceptor shaft passage 195 is disposed centrally through the lower module body 182. The susceptor shaft passage 195 allows the support shaft 155 of the susceptor assembly 124 and a portion of the lower window 120 to pass through the lower module body 182.

The pyrometer passage 192 is disposed through the lower module body 182 outward of the susceptor shaft passage 195 to enable a lower pyrometer 190, such as a scanning pyrometer, to measure the temperature of the bottom surface of the substrate 150 or a bottom surface of a susceptor 157 of the susceptor assembly 124. The lower pyrometer 190 is disposed below the lower module body 182 adjacent to the pyrometer passage 192. The pyrometer passage 192 extends from the bottom surface of the lower module body 182 to the top surface of the lower module body 182.

An upper chamber volume 111 is the portion of a process volume 110 in which the substrate 150 is processed and one or more process gases are injected. The lower chamber volume 113 is the portion of the process volume 110 in which the substrate 150 is loaded onto (or removed from) the susceptor assembly 124. The upper chamber volume 111 may also be understood as the volume above the susceptor 157 while the susceptor assembly 124 is in a processing position. The susceptor assembly 124 is shown in a lower position (e.g., a loading position for the substrate 150) in FIG. 1. The lower chamber volume 113 is understood to be the volume below the susceptor 157 of the susceptor assembly 124 while the susceptor assembly 124 is in the processing position. The processing position is the position wherein the substrate 150 is disposed even with or above the horizontal plane 125.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the inject ring 116. The upper cooling ring 118 includes a coolant passage 146 disposed therethrough. The coolant which is circulated through the coolant passage 146 may include water, oil, or another fluid. The lower cooling ring 112 includes a coolant passage 148 disposed therethrough. The coolant which is circulated through the coolant passage 148 is similar to the coolant circulated through the coolant passage 146 of the upper cooling ring 118. The upper cooling ring 118 and the lower cooling ring 112 can assist in securing the inject ring 116 in position. The upper cooling ring 118 may partially support the upper housing module 102 while the lower cooling ring 112 may partially support the lower housing module 104.

The use of the upper cooling ring 118 and the lower cooling ring 112 can reduce the temperature of the inject ring 116 without the need for additional cooling channels being disposed through the inject ring 116. Using the upper cooling ring 118 and the lower cooling ring 112 reduces the cost of the production of the inject ring 116, which can be more frequently replaced than the upper cooling ring 118 and the lower cooling ring 112. The present disclosure contemplates that the inject ring 116 can include one or more additional cooling passages formed therein.

One or more gas injectors 108 are disposed through one or more openings within the inject ring 116 to provide gases, such as process gases, to the process volume 110. The present disclosure contemplates that a plurality of gas injectors can be disposed through the inject ring 116 The gas injector may be positioned at an angle of greater than about 5° from an X-Y plane of the substrate 150, such as greater than about 10° from the X-Y plane. Each of the injectors are fluidly coupled to one or more process gas supply sources, such as the first process gas supply source and/or the second process gas supply source. In some embodiments, only a first process gas supply source is utilized. In some embodiments in which both the first process gas supply source and the second process gas supply source are utilized, there can be two gas outlets within each gas injector. According to some embodiments, which can be combined with other embodiments, the first process gas supply source is a process gas while the second process gas supply source is a cleaning gas. The cleaning gas can be used to clean features of the ISR system 185 in the process volume 110 and/or features of the reflectometer system in the process volume 110.

The upper window 122 is disposed between the inject ring 116 and the upper housing module 102. The upper window 122 is an optically transparent window, such that radiant energy produced by the upper housing module 102 may pass therethrough. The upper window 122 is formed of a quartz or a glass material. The upper window 122 is a dome shape and can be referred to as an upper dome, although a planar window is also contemplated. The outer edges of the upper window 122 form one or more peripheral supports 172. The peripheral support 172 is thicker than the central portion of the upper window 122. The peripheral support 172 is disposed on top of the inject ring 116. The peripheral support 172 connects to the central portion of the upper window 122. The peripheral support 172 is optically opaque, and can be formed of opaque quartz.

The lower window 120 is disposed between the susceptor assembly 124 and the lower housing module 104. The lower window 120 is an optically transparent window, such that radiant energy produced by the lower housing module 104 may pass therethrough. The lower window 120 is formed of a quartz or a glass material. The lower window 120 can be a dome shape and can be referred to as a lower dome, however a planar lower window 120 is also contemplated. Outer edges of the lower window 120 form a peripheral support 170. The peripheral support 170 is thicker than a central portion of the lower window 120. The peripheral support 170 connects to the central portion of the lower window 120.

A variety of liners and heaters are disposed inside of the chamber body assembly 106 and within the process volume 110. As shown in FIG. 1, there is an upper liner 156 and a lower liner 154 disposed within the chamber body assembly 106. The upper liner 156 is disposed above the lower liner 154 and inward of the inject ring 116. The upper liner 156 and the lower liner 154 are configured to be coupled together and/or the upper liner 156 is supported on the lower liner 154. The upper liner 156 and the lower liner 154 are configured to shield the inner surfaces of the inject ring 116 from the process gases within the process volume 110. The upper liner 156 and the lower liner 154 further serve to reduce heat loss from the process volume 110 to the inject ring 116. Reduced heat loss improves heating uniformity of the substrate 150 and enables more uniform deposition or etching on the substrate 150 during processing operations (e.g., the epitaxial processing operations). The preheat ring (PHR) 161 is supported on a ledge 160 of the lower liner 154. The PHR 161 and the edge of the substrate are located within a radially outward area of the process volume 110.

An upper heater 158 and a lower heater 152 are also disposed within the chamber body assembly 106 and the process volume 110. As shown in FIG. 1, the upper heater 158 is disposed between the upper liner 156 and the inject ring 116 while the lower heater 152 is disposed between the lower liner 154. Both of the upper heater 158 and the lower heater 152 are disposed inward of the chamber body assembly 106 to enable more uniform heating of the substrate 150 while the substrate 150 is within the process chamber 100. The upper heater 158 and the lower heater 152 reduce heat loss to the walls of the chamber body assembly 106 and create a more uniform temperature distribution around the process volume 110. Both the upper heater 158 and the lower heater 152 may be configured to have a heated fluid run therethrough or may be resistive heaters. The upper heater 158 and the lower heater 152 are further shaped to accommodate openings through the inject ring 116, such as a substrate loading port.

The susceptor assembly 124 is disposed within the process volume 110 and is configured to support the substrate 150 during processing. The controller 196 is configured to rotate the susceptor assembly 124 and the substrate 150 during the substrate processing operation. The susceptor assembly 124 includes the planar substrate support surface 153 for supporting the substrate 150 and the shaft 155 which extends through a portion of the lower window 120 and the lower housing module 104. The susceptor assembly 124 is coupled to a movement assembly 194. The movement assembly 194 includes for examples, one or more motors or actuators. The movement assembly 194 is coupled to a controller 196 for inducing at least rotation (step or continuous) about a central axis, axis A, vertical movement of the susceptor assembly 124, angular tilt of the susceptor assembly 124, or other movement. The controller 196 can report the susceptor assembly 124 characteristics to the spectrometer and can at least instruct the light source 244 to flash. According to some embodiments the rotation assembly controller 196 can receive and store data.

Figure 2A:
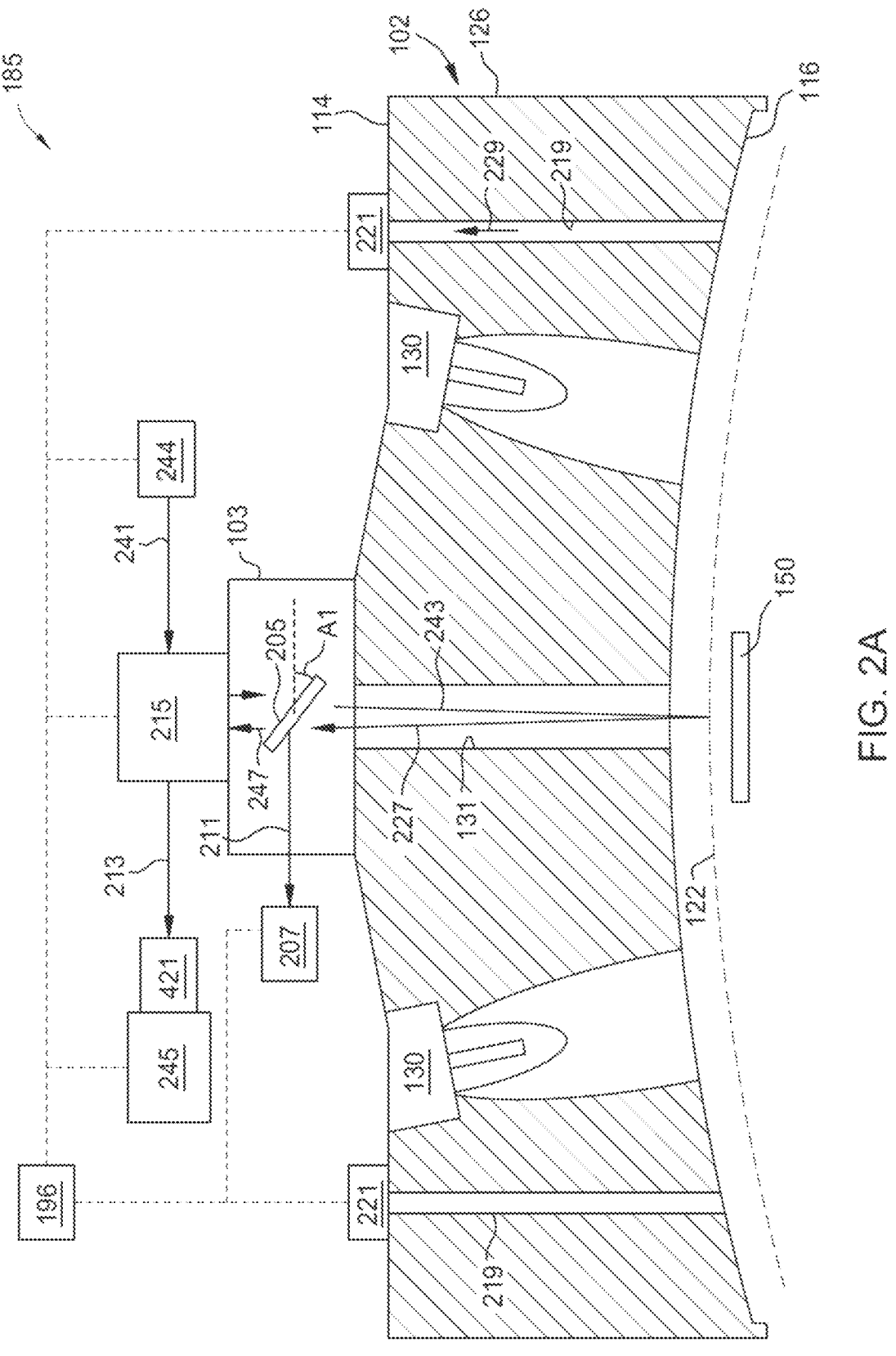
FIG. 2A is a partial schematic cross-sectional view of the In-Situ Reflectometry (ISR) system shown in FIG. 1 where light reflected from the dichroic mirror is transmitted to a pyrometer, according to one or more implementations.

FIG. 2A is a partial schematic cross-sectional view of the ISR System 185 of the system 101 shown in FIG. 1, according to some implementations. The ISR System 185 further includes a light source 244, a collimator 215, a sensor 245, a pyrometer 207, one or more preheat ring sensors 221 (two are shown), and a dichroic mirror 205 coupled to or disposed above the upper housing module 102. The ISR System 185 facilitates measurement of one or more properties of the substrate 150, and/or a film disposed thereon, and/or an epitaxial process. Example properties include temperature, film growth rate, thickness of a film, film optical properties, film selectivity of an epitaxial process, and/or in-film Ge and dopant (e.g., phosphorus, boron, etc.) concentration.

The light source 244 is configured to generate light 241. For example, the light source 244 could be a flash lamp, capable of producing full spectrum or partial spectrum light. In one example, the spectrum of light generated has a wavelength between about 200 nm to about 4 micrometers, such as 200 nm to about 800 nm and/or 3 micrometers to 4 micrometers. Full spectrum light allows for a wide range of light signals for analysis, however in other embodiments a light source may be limited to a specific wave length of light or specific range of light wave lengths to accomplish the analysis. The light source 244 may be controlled by the controller 196. The light source 244 is in optical communication with a collimator 215, and directs light 241 to the collimator 215 upon instruction of the controller 196. Optical communication includes connected by a fiber optic cable, but other modes of light transmission are contemplated. The travel path of the light from the light source 244 may be referred to as a propagation path. The collimated light 243 leaves the collimator 215, and travels through a pyrometer passage 131. The collimated light 243 may leave the collimator 215 as a beam. The beam has a diameter of about 1 mm to about 15 mm, such as about 3 mm to about 4 mm. The pyrometer passage 131 can be a made of any material capable of transmitting light of predetermined wavelengths, for example, sapphire. The pyrometer passage 131 directs the collimated light 243 to the surface of the substrate 150 (or a film thereon) to facilitate measurement of one or more properties of the substrate 150 (or a film thereon). In addition to, or as an alternative to, measurement of a substrate 150, it is contemplated that the susceptor surface, the coupon surface on the PHR 161 (or other surface) could be measured. For example the substrate, susceptor surface, or coupon surface could be measured to establish an initial data set for a wobble calibration metric.

As used herein, film and substrate or coupon may be used interchangeably, unless the description explicitly excludes one or the other.

The collimated light 243 is reflected off the target measurement surface, such as substrate 150, and is reflected back as reflected light 227. The reflected light 227 travels back through the pyrometer passage 131. The reflected light 227 leaves pyrometer passage 131 and travels to a dichroic mirror 205 aligned with the pyrometer passage 131 along the travel path of the reflected light 227. According to some embodiments the dichroic mirror 205 is a transparent material with a dielectric coating. The dielectric coating may include, but is not limited to, magnesium fluoride, tantalum pentoxide, and titanium dioxide. The dichroic mirror 205 reflects certain wavelengths of light away, but allows other specifically selected wavelengths to pass through. A wavelength range directed to a sensor 245 may be between about, 100 nm and about 1000 nm, such as within a range of 200 nm and 800 nm, such as within a range of 200 nm and 400 nm, and such as within a range of 400 nm and 800 nm. The dichroic mirror 205 enables multiple light based sensors to be utilized by directing light of a first desired range of to one sensor with the remaining light wavelengths being sent to at least another sensor. Thus, the ISR system 185 provides a compact measurement system, allowing more sensors to be included in a smaller footprint. The dichroic mirror 205 is arranged, or oriented, at an angle of incidence A1 between about, 30° and about 60°, such as within a range of 35° and 55°, with a plane near orthogonal to a longitudinal axis of the pyrometer passage 131. However, other angles of incidence are contemplated.

According to FIG. 2A, light reflected from the dichroic mirror 205 is transmitted to a pyrometer 207 along light path 211. According to some embodiments, only light wavelengths between about 1.0 µm and about 6.0 µm, such as between about 3.0 µm and about 4.0 µm, travel along light path 211 to a pyrometer 207. As noted above, properties of the dichroic mirror 205 are select to transmit or reflect light in specified wavelength ranges. Light 247 allowed to pass through the dichroic mirror 205 is collimated by the collimator 215. The collimated light 213 is directed to the sensor 245. For example, the sensor 245 can be optical spectrometer, a spectrograph configured to measure wavelength-resolved intensity. The sensor 245 can additionally include a grating, an optical lens, a filter 421, and/or a linear-array photodiode detector. The filter 421 can be a short pass filter to limit the noise from a lamp 130, or a dielectric filter. A dielectric filter includes any film based filters than can prevent specific wavelength of light from passing therethrough. While the filter 421 is described as part of the sensor 245, it is contemplated that the filter can be located in other locations. For example, the filter 421 can be part of the dichroic mirror 205. The filter 421 is configured to allow light only of a specified wavelength to pass therethrough. In one example, the filter 421 only allows light of wavelengths below 550 nm to pass therethrough to mitigate light signal noise from lamps of the process chamber, thus improving measurement accuracy. It is contemplated that the filter 421 can be placed in any light path that includes the light reflected off the substrate 150 (e.g., reflected light 227, to the sensor 245) (e.g., reflected light 247 from dichroic mirror 205) (e.g., collimated light 243). In one example, the filter 421 is an integral component of sensor 245, but in other examples, the filter 421 is a standalone component from the sensor 245. According to some embodiments, the filter 421 is not included in the path, reducing the cost, complexity, and footprint of ISR system 185. It is to be noted that while embodiments described herein may include a filter 421 and/or a dichroic mirror 205, both the filter 421 and the mirror 205 are optional and may be excluded from any embodiment or implementation described herein, as benefits may be achieved in the absence thereof.

The pyrometer 207, the one or more PHR sensors 221, and sensor 245 may be connected to the controller 196 to facilitate control and/or operation thereof. The controller 196 can store information, data, algorithms, or other control parameters for causing the performance of actions described herein. The controller 196 includes a central processing unit (CPU), a memory containing instructions, and support circuits for the CPU. The controller 196 controls various items directly, or via other computers and/or controllers. In one or more embodiments, the controller 196 is communicatively coupled to dedicated controllers, and the controller 196 functions as a central controller.

The controller 196 includes a computer processor (e.g., CPU) that is used for controlling various substrate processing chambers and equipment, and sub-processors thereon or therein. The memory, or non-transitory computer readable medium, is one or more of random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits of the controller 196 are coupled to the CPU for supporting the CPU. The support circuits include cache, power supplies, clock circuits, input/output circuitry and subsystems, and the like. Operational parameters and instructions are stored in the memory as a software routine that is executed or invoked to turn the controller 196 into a specific purpose controller to control the operations of the system 101 described herein. The controller 196 is configured to conduct any of the operations described herein. The instructions stored on the memory, when executed, cause one or more of operations described herein to be conducted.

The ISR system 185 may optionally include one or more PHR sensors 221, positioned to receive data indicating properties of a preheat ring of the system 101. Each PHR sensor 221 is configured to be in line (e.g., vertically and/or optically aligned) with a PHR sensor passage 219. The PHR sensor 221 is a spectrometer or a channel of a multi-channel spectrometer configured to measure a property of a preheat ring (PHR), such as PHR 161 (shown in FIG. 1). In one example, each PHR sensor 221 is configured to read a reference material within or on the PHR 161 for use as a film selectivity reference. For example, the reference material can be a crystalline coupon of known properties. Each PHR sensor passage 219 extends between the bottom surface and the upper surface of the upper module body 126. In such an example, the PHR sensor passage is vertically aligned with (and/or directed at) PHR 161 (shown in FIG. 1). The PHR sensor passage 219 may be sealed at upper and lower ends thereof by a material capable of transmitting light 229, such as quartz or sapphire. In another embodiment, each PHR sensor passage 219 includes a fiber optic cable disposed thereon. It is contemplated that a sensor similar to PHR sensor 221 can be employed on the system 101 to analyze the substrate-edge, alone or in conjunction with a pyrometer, to measure film selectivity and other properties of the substrate-edge.

During processing, light from the light source 244 is used to determine the film selectivity of the epitaxial process. The light is directed from the light source 244, for example by a fiber optic cable, to a collimator 215. The collimator 215 directs the light toward a surface to be measured (e.g., the substrate 150). The light is reflected off of that surface, as a reflected light. The reflected light from the measured surface of the substrate 150 facilitates measurement of film selectivity. The reflected signal travels back to the dichroic mirror and is split into multiple paths (e.g., propagation sub-paths). A first propagation sub-path directs reflected light to the pyrometer 207, while a second propagation sub-path directs reflected light to the collimator 215 and then to the sensor 245. The light intensity collected by the sensor 245 is analyzed for true reflectance, which is compared with film-models, for example (Fresnel equations) using nonlinear fitting equations or other empirically derived equations to determine film selectivity.

In one example, film selectivity models are empirically derived by obtaining absorption/reflectance data for light at predetermined wavelengths for various films. For example, the wavelength of light is from about 200 nm to about 800 nm, such as from about 410 nm to about 430 nm. The data may be collected at process conditions which approximate those of a predetermined process recipe for processing future substrates, such as a process recipe at which the model will be utilized. The data is then fit to an equation, such as a non-linear equation. Light received by the sensor 245 is analyzed for intensity (e.g., true reflectance of light reflected from the measured specimen) and fit to the empirically derived equation to determine film selectivity. Stated otherwise, the amount of light reflected from the substrate 150 surface changes as a function of the selectivity of a film on the substrate 150 surface. For example, in the wavelengths from about 410 nm to about 430 nm, the reflected signal intensity decreases with the selective deposition of the film material (e.g., SiP), while the reflected signal intensity increases for non-selective deposition. Therefore, if the deposition of the film becomes non-selective (based on the reflected signal intensity), the ISR system 185 is configured to detect a change in the reflected signal intensity to determine the film selectivity. This data and/or equations may also take into account other optical properties, such as refractive index and extinction coefficient, of films to improve measurement accuracy.

The obtained absorption/reflectance data may be analyzed to determine potential signatures related to nodule generation. Distinctive signatures are generated for selective versus non-selective processes. Within a measured band of wavelengths, for example, a selective epitaxial process on a substrate 150 may exhibit a decreasing reflectance signal, while a non-selective process may exhibit an increasing reflectance signal. During the processing of the substrate 150, the absorption/reflectance data and film selectivity models are used to monitor the substrate 150 for changes in the signal which may be indicative of a shift in the epitaxial process, e.g., from selective deposition to non-selective deposition. In the event that such changes are detected, the controller 196 can alter the processing conditions to shift the process back to selective deposition. For example, in the wavelengths from about 410 nm to about 430 nm, the reflected signal intensity decreases with the selective deposition of the film material (e.g., SiP), while the reflected signal intensity increases for non-selective deposition. Therefore, if the deposition of the film becomes non-selective (based on the reflected signal intensity), the ISR system 185 is configured to detect a change in the reflected signal intensity and alter the processing conditions to shift the process back to a selective deposition. Further, the absorption/reflectance data and film selectivity models may be used to monitor the substrate 150 for changes such as film defects. For example, if a film has defects, the signal may become non-selective. By identifying the beginning of the selectivity loss, real time control of the processing conditions are enabled, which can be altered to account for the film defects.

Figure 2B:
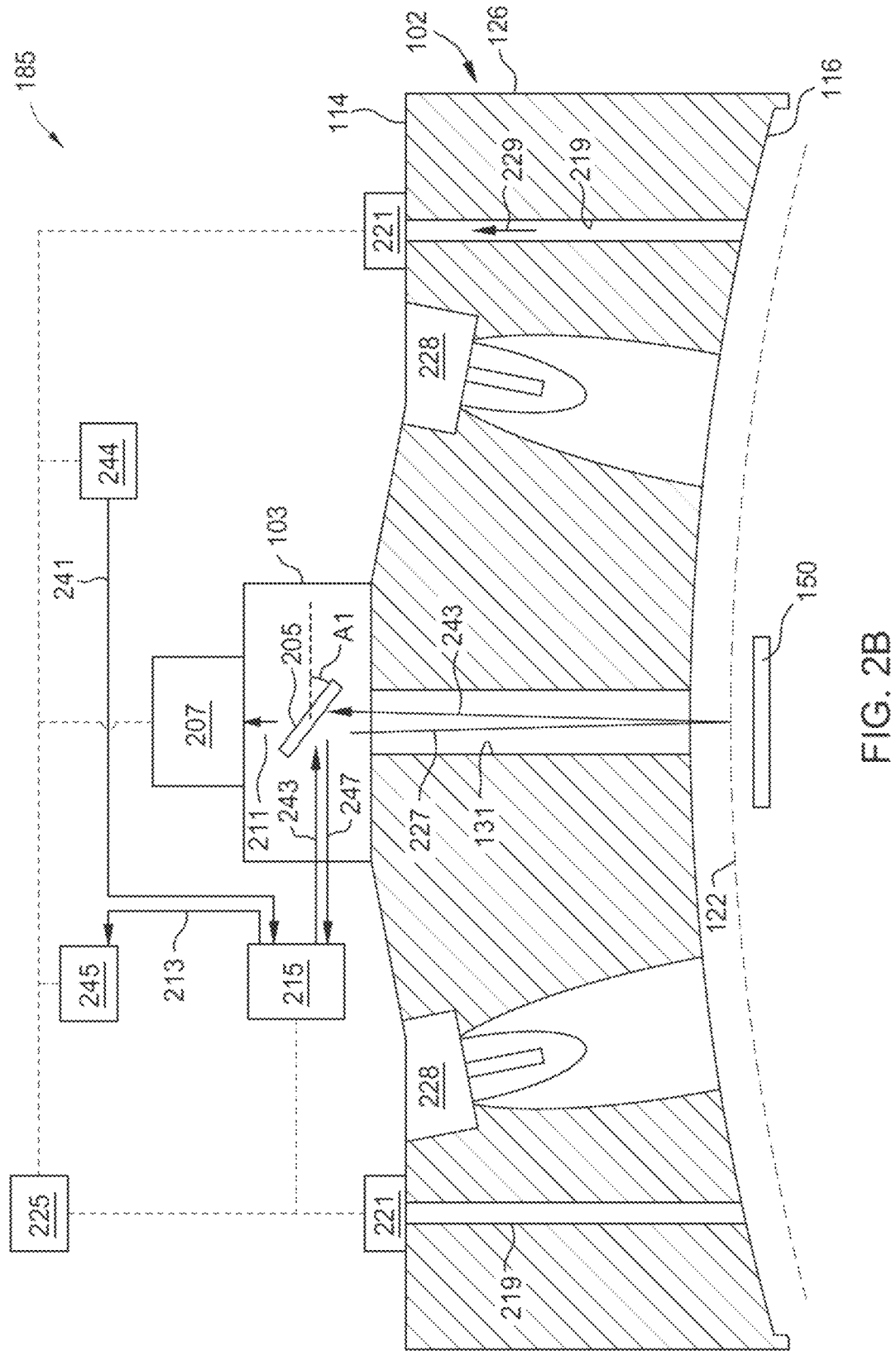
FIG. 2B is a partial schematic cross-sectional view of the ISR system shown in FIG. 1 where the pyrometer receives the light that passes through the dichroic mirror, according to some implementations.

FIG. 2B is a partial schematic cross-sectional view of the system shown in FIG. 1, according to some implementations. FIG. 2B is similar FIG. 2A, however, the pyrometer 207 receives the light 247 that passes through the dichroic mirror 205, and the collimator 215 receives the light 247 reflected from the dichroic mirror 205. The collimator 215 can then collimate the light 247 from the dichroic mirror 205. The sensor 245 can then receive the collimated light 213. According to some embodiments which can be combined with other embodiments, the collimator 215 may receive and collimate the reflected light 227 from the substrate prior to the dichroic mirror 205. In such an embodiment, the dichroic mirror 205 receives collimated light. As illustrated in FIG. 2B, the pyrometer 207 is located above the mirror housing 103, and the reflected light 227 and has a shorter path to the pyrometer 207.

The measured light intensity of the collimated light 213 is used to determine a film selectivity on the surface of the substrate 150. For example, a lower light intensity may indicate a more film selectivity (as more light is absorbed), and a higher light intensity may indicate a less film selectivity (as more light is reflected, i.e., the film is hazy due to nodule formation), or vice versa depending on the composition and optical properties of the particular material being measured.

A selectivity of the film formation on the surface of the substrate 150 affects the light intensity of the collimated light 213 received by the sensor 245, such that a change in the light intensity can signal a change in the selectivity of the film formation on the surface of the substrate 150. In one or more examples, a measurement spectra of the return collimated light 213 may be filtered to provide values indicating measured light intensity only within a selected wavelength range. This range of wavelengths is beneficial because radiation from lamps (such as upper lamps 130) is filtered out to improve measurement accuracy at the sensor 245. The optical filter 421 may be used to block a portion of the reflected light 227 which includes light with a wavelength outside a selected wavelength range. This may occur, for example, when light from the upper lamps 130 (or other lamps) is directed into the pyrometer passage 131, such as by reflecting off of one or more internal chamber surfaces. The inadvertent light may otherwise affect measurements results at the sensor 245, and therefore, filtering the unintended wavelengths improves measurement accuracy. In one or more examples, the selected wavelength range may exclude infrared light in order to reduce the effect of background infrared lamp radiation. In one non-limiting example, the wavelength range generated by the light source 244 is light at a wavelength within a range of about 200 nm to about 780 nm, such as about 200 nm to about 500 nm, or 200 nm to about 400 nm, or about 500 nm to about 700 nm. The upper lamps 130 (or other lamps within the chamber), but may be infrared lamps. In such an example the filter 421 filters (restricts passage) of light in the infrared wavelength range (IR-A, IR-B, and/or IR-C), such as light having a wavelength of 780 nm to 1.3 micrometers. Therefore, the sensor 245 receives only light generated from the light source 244, improving measurement accuracy of light reflected from a surface of the substrate 150. In another example, the filter 421 filters light of 500 nm or greater, such as 550 nm or greater, as signal degradation at high temperature (e.g., 200 degrees C. and above, such as 600 degrees C. and above) begins to occur within a range of 500 nm-550 nm, and degradation occurs at wavelengths thereabove. Embodiments disclosed herein reduce interference from infrared lamp radiation which increases a signal-to-noise ratio of the light sensor 245 for more accurate film selectivity measurements.

The sensor 245 is used to monitor film selectivity in-situ in the processing chamber 100 and in real-time during substrate processing. In-situ monitoring improves throughput compared to conventional approaches, since substrates need not be removed from the process chamber for selectivity measurements to occur. In one example, which can be combined with other examples, the light intensity of the return collimated light 213 is monitored continuously throughout substrate processing, or on predetermined intervals throughout substrate processing. Once a desired film formation is achieved, the epitaxial process is stopped. The substrate 150 may then be removed from the process chamber 100, or further processing may occur within the process chamber 100 according to a process recipe.

Figure 3:
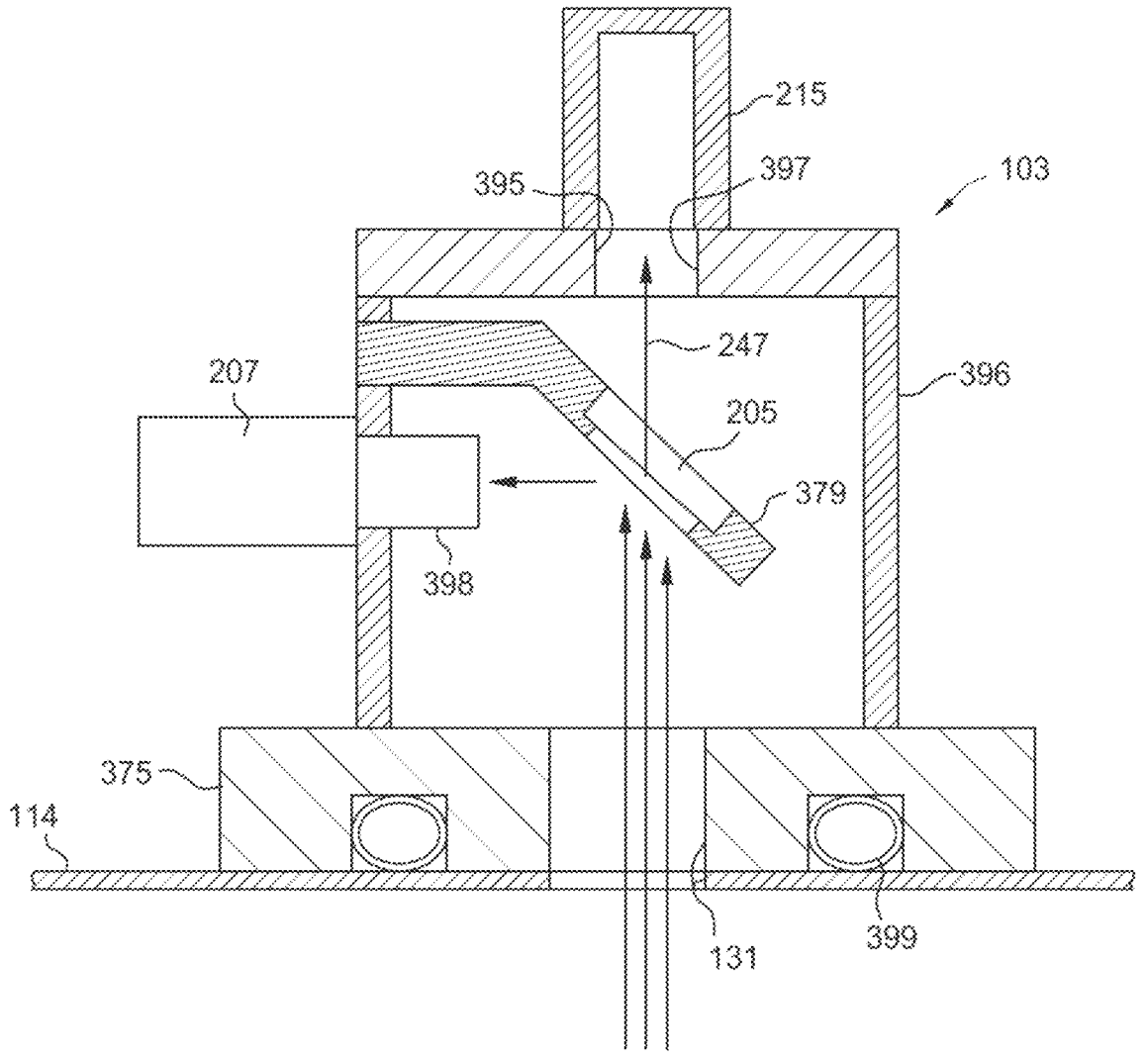
FIG. 3 is a partial cross-sectional view of the ISR system shown in FIG. 1, according to one or more implementations.

FIG. 3 is a partial cross-sectional view of the ISR system 185 shown in FIG. 1, according to one implementation. The mirror housing 103 includes a top plate 395 coupled to sidewalls 396. The top plate 395 includes an aperture 397 adjacent the collimator 215, while sidewall 396 includes an aperture 398 therein adjacent the pyrometer 207. The pyrometer 207 and the collimator 215 are coupled to the mirror housing 103. The mirror housing 103 is made of a metal alloy, such as an aluminum-containing alloy or steel, and houses the dichroic mirror 205 therein. The mirror housing 103 is coupled to cooling plate 375. The cooling plate 375 is designed to keep the mirror housing 103 at a predetermined temperature to improve longevity of the mirror housing 103 and components therein. Additionally or alternatively, the cooling plate 375 maintains the dichroic mirror 205 within a temperature range of predetermined optical properties, in the event the dichroic mirror 205 has different optical properties at different temperatures. The cooling plate 375 includes one or more coolant channels 399 formed therein which are coupled to a cooling system. The cooling plate 375 is also made of a metal alloy, such as an aluminum-containing alloy or steel. The cooling plate 375 includes an aperture 363 formed therein adjacent pyrometer passage 131. The cooling plate 375 is between the mirror housing 103 and the upper housing module 102 to reduce heat transfer from the upper housing module 102 to the mirror housing 103. The mirror housing 103 may include a mirror plate adapter 379 disposed therein for supporting the dichroic mirror 205. The mirror plate adapter 379 holds the dichroic mirror 205 in a predetermined orientation and position, such as at the angle of incidence A1 (shown in FIG. 2A). In one example, the mirror plate adapter 379 is coupled to the mirror housing 103, but other support configurations are contemplated. The mirror plate adapter 379 facilitates proper positioning of the dichroic mirror 205 without obstructing a propagation path of light. Additionally, the mirror plate adapter 379 facilitates easy removal of the dichroic mirror 205 for replacement or cleaning.

Figure 4:
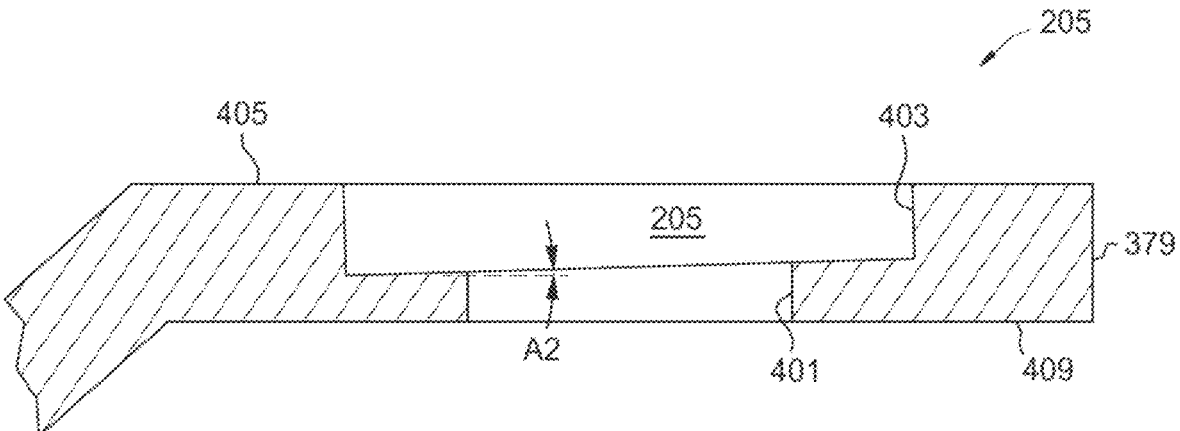
FIG. 4 is a cross-sectional view of a short-pass filter adapter plate, according to one or more implementations.

FIG. 4 is a cross sectional view of the mirror adapter plate 379 according to one embodiment. The mirror adapter plate 379 is formed from a metallic, ceramic, or polymeric material includes a recess 403 formed therein adjacent an aperture 401. The dichroic mirror 205 is disposed in the recess 403 and is secured by an adhesive, a mechanical fit, or mechanical fasteners such as tabs. The recess 403 can be angled at an angle A2 from a first surface 405 of the mirror adapter plate 379. The angle A2 can be used for fine adjustment of the dichroic mirror 205. The angle A2 can be about 0° to about 10° with respect to the first surface 405, such as an angle of about 0.1° to about 5° with respect to the first surface 405.

It is contemplated that an adapter plate similar to the adapter plate 379 may also be used to support the filter 421 within the propagation path of light generated by the light source 244. In such an example, the filter may be a circular optical element configured to filter (remove) select wavelengths of light. Similarly, an adapter plate for a filter facilitates improved positioning of a filter 421, as well as improved removal of the filter 421 for replacement or cleaning.

Figure 5:
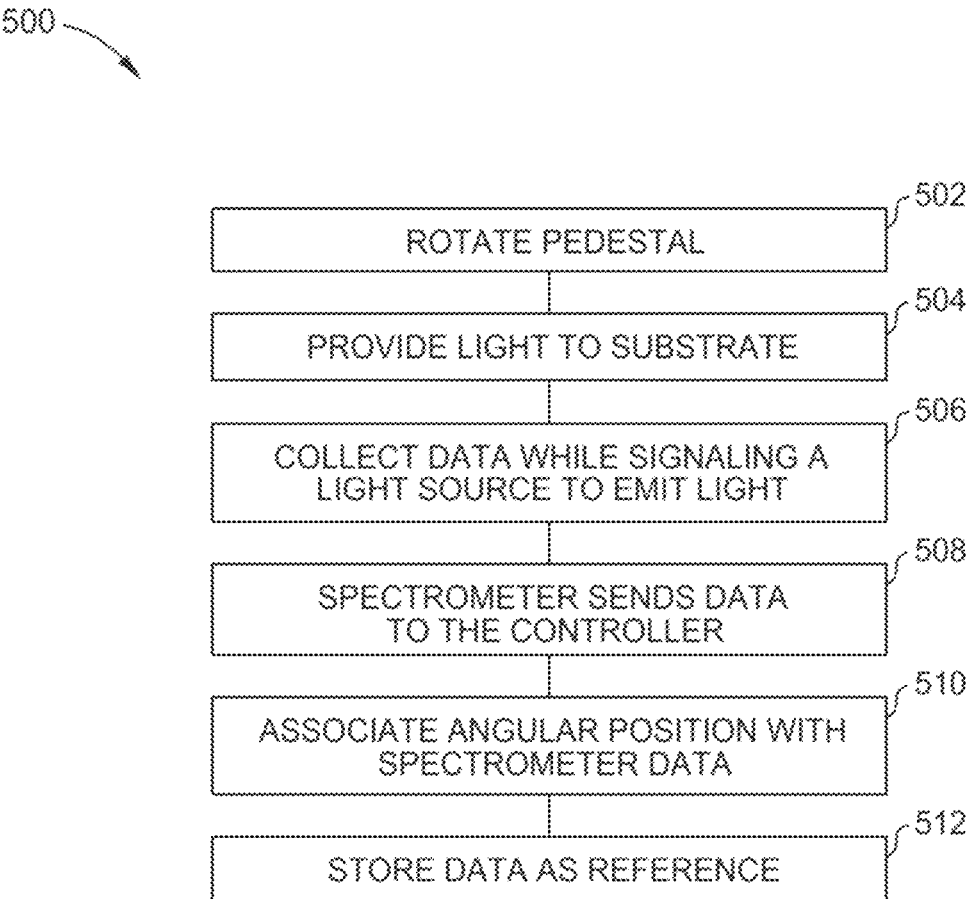
FIG. 5 is a schematic block diagram view of a method of calibrating a substrate for in-situ reflectometry, according to one or more implementations.

FIG. 5 is a schematic block diagram view of a method 500 of calibrating the rotation of the susceptor assembly 124. The susceptor assembly 124 includes a susceptor 157. The method 500 is described with respect to FIG. 1 and FIG. 2A to facilitate explanation, but it is contemplated that the method 500 may be used with systems other than system 101 of FIG. 1. It is further contemplated that the controller 196 may instruct or otherwise control one or more aspects of the method 500. The method 500 accounts for wobble of a susceptor 157 while using in-situ reflectometry. For example, during processing, the susceptor assembly 124 (shown in FIG. 1), and thus the substrate 150 thereon, are rotating during processing. However, due to mechanical tolerances or other factors, the susceptor assembly 124 wobbles about a longitudinal (e.g., central) axis of the support shaft 155. The wobble of the support shaft 155 induces in-plane wobbling of the susceptor 157, and the substrate 150, thereon, during rotation. The in-plane wobbling unintentionally changes the distance of the propagation path between sensors within the system (e.g., sensor 245, pyrometer 207, and preheat ring sensors 221) and the specimen being measured (e.g., the substrate 150 and the preheat ring 161 and/or coupon thereon). The change in distance of the propagation path may affect measurement accuracy and thus film selectivity measurement accuracy. However, the method 500 mitigates reduced measurement accuracy due to wobble of the susceptor assembly 124.

The method 500 utilizes a reference substrate to determine and account for wobble. The method 500 begins at operation 502, in which a susceptor assembly 124 and a reference substrate thereon are rotated. The reference substrate is a substrate having known physical properties, such as surface reflectance and optical properties like refractive index and extinction coefficient. The controller 196 causes the susceptor assembly 124 to rotate in a continuous or stepwise manner.

In operation 504, the light source 244 directs light to surface of reference substrate along a propagation path. The light from the light source 244 is provided at a known intensity and wavelength (or range of wavelengths), such as the range or wavelengths measured by sensor 245. The light from the light source 244 is provided at a prescribed angular position of the susceptor assembly 124. Operation 504 also includes recording an angular position of the susceptor assembly 124 at the time light is provided from the light source 244. Thus, an association between the angular position of the susceptor assembly 124 and light for measurements of the reference substrate can be later derived, as described below. It is contemplated that the light from the light source 244 may be triggered by a controller instruction, or in response to a physical trigger (e.g., a contact switch).

The angular position of the susceptor assembly 124 can be determined, for example, by rotating the susceptor assembly 124 with an actuator of known angular position (for example, using a step encoder). Additionally or alternatively, an angular position of the susceptor assembly 124 can be determined using optical signals. In such an example, the shaft 155 of the susceptor assembly 124 may include a reflector on a portion thereof. As the shaft 155 rotates, an optical signal may be provided to and received from the reflector by a sensor to determine an angular position of the shaft 155. It is contemplated that other methods of determining angular position may be utilized, such as the use of a stepper motor with steps of known angular distance. In another example, the susceptor assembly 124 may be rotated at a constant specified rate, while a stage encoder provides data related to the angular position of the susceptor assembly 124 to the controller 196. The controller 196 causes light from the light source 244 to be directed to the substrate at a predetermined interval, and the controller 196 associates each data spectrum collected by the sensor 245 with the known angular position of the susceptor assembly 124. In such an example, a trigger for initiating propagation of light from the light source 244 may be omitted, thereby simplifying hardware and reducing costs.

Operation 506 includes collecting reflected light 227 from the reference substrate. The sensor 245, such as a spectrometer, receives the reflected light 227. The sensor converts the received light to spectrum data. In operation 508, the sensor 245 sends the spectrum data to the controller 196. In operation 510, the controller 196 associates the received spectrum data with angular positions of the susceptor assembly 124. Because the physical properties of the reference substrate is known, spectrum data which is inconsistent (e.g., shows variations in selectivity that deviate from known values of the reference substrate) can be attributed to wobble of the susceptor assembly 124. The controller 196 can determine corrective factors for each angular position of the susceptor assembly 124 to account for the wobble. Thus, as the sensor 245 receives data during processing of non-reference substrates, the corrective factors are applied to received measurements to account for substrate wobble and variations induce by rotating members, thereby improving the accuracy of film selectivity measurements.

In operation 512, the combination of angular positions and spectrum data is used to create a data set as a reference for in-situ reflectometry. The data set is stored in the controller 196. It is contemplated that the data set may be updated at predetermined intervals, such as preventative maintenance is performed in the system 101. In some aspects, machine learning or artificial intelligence can be applied to improve the collection and application of the data set for improved film measurement.

The present disclosure contemplates that the operations 502-512 of the method 500 can be repeated one or more times to improve the collection and application of data which correlates angular position of the susceptor assembly 124 with a received light signal. According to some embodiments, which can be combined with other embodiments, operations 502-512 are repeated for a second substrate, such as a different reference substrate, for confirmation and/or further refinement of the corrective factors previously determined.

During processing of substrates, each measurement by sensor 245 is corrected according methodologies described above. Additionally or alternatively, other methodologies may be employed during processing of substrates to account for susceptor assembly wobble. In one example, measurements are taken at the same specified angular position, and only that angular position, thereby improving consistency. In yet another example, measurements may be averaged, or yet another embodiment, measurements may be plotted and a trend line or other function can be applied, to account for deviations due to wobble. In instances where the wobble produces a sinusoidal curve, a cosine function may be fitted to the data, for each wavelength in the spectrum, where:

$$R_{fit}(t) = A\cos(2\pi ft + \varphi) + R_{ave}$$

$$A = \text{amplitude}, f = \text{frequency (Hz)},$$

$$\varphi = \text{phase shift, and } R_{ave} = \text{average signal level}.$$

In yet other examples, it is contemplated that the method 500 may be omitted from processing of substrates. In such an example, no correction for wobbling may be applied. In other examples, measurements may be normalized to reduce error attributable to issues stemming from at least movement caused by rotation, machining tolerances, manufacturing limitations, material properties, wear on the system, and other possible sources of error.

The operations of 500 can also be accomplished by an algorithm, utilizing time to determine the angular position of the susceptor assembly 124. In some embodiments the operations can be retrofitted to existing process chambers wherein two controllers are used to action a sensor 245 to take a measurement of the angular position of a susceptor 157. The angular position of the susceptor 157 can be determined either by a position sensor or a by a computer algorithm using a variable, for example time.

FIG. 6 is a schematic block diagram view of a method 600 of monitoring film selectivity of an epitaxial process. At operation 602, an epitaxial process is performed on a substrate 150. The substrate 150 is provided to a susceptor assembly 124 in a process chamber 100. The epitaxial process is a process having known signal properties, such as the general shape or trend of a signal-to-reference ratio versus wavelength graph or signal-to-reference ratio versus time graph.

At operation 604, light is generated from a light source and collimated to form a collimated light beam. At operation 606, the light source 244 directs the collimated light beam to a surface of the substrate along a propagation path. The light from the light source 244 is provided at a known intensity and wavelength (or range of wavelengths), such as the range or wavelengths measured by sensor 245. The light from the light source 244 is provided at a prescribed position of the susceptor assembly 124. It is contemplated that the light from the light source 244 may be triggered by a controller instruction, or in response to a physical trigger.

At operation 608, a reflected light 227 is collected from the substrate 150 by a sensor 245. The collimated beam is reflected off of the substrate surface to produce the reflected light 227. The sensor 245, such as a spectrometer, receives the reflected light 227 throughout the duration of the epitaxial process. The sensor converts the received light into spectrum data.

In operation 610, the sensor 245 sends the spectrum data to the controller 196. At operation 612, the controller 196 analyzes the spectrum data derived from the spectrometer to determine the film selectivity of the epitaxial process. The controller 196 associates the received spectrum data with signal properties of the epitaxial process. Because the signal properties of the epitaxial process are known, spectrum data that is inconsistent (e.g., shows variations in signal properties that deviate from known values of the epitaxial process)

can be attributed to non-selectivity of the epitaxial process. At operation 614, the controller 196 alters the epitaxial process to correct for non-selectivity. The controller 196 can determine corrective factors to account for the non-selectivity.

In operation 616, the spectrum data is used to create a data set as a reference for in-situ reflectometry. The data set is stored in the controller 196. It is contemplated that the data set may be updated at predetermined intervals, such as preventative maintenance is performed in the system 101. In some aspects, machine learning or artificial intelligence can be applied to improve the collection and application of the data set for improved film measurement.

Figure 7A:
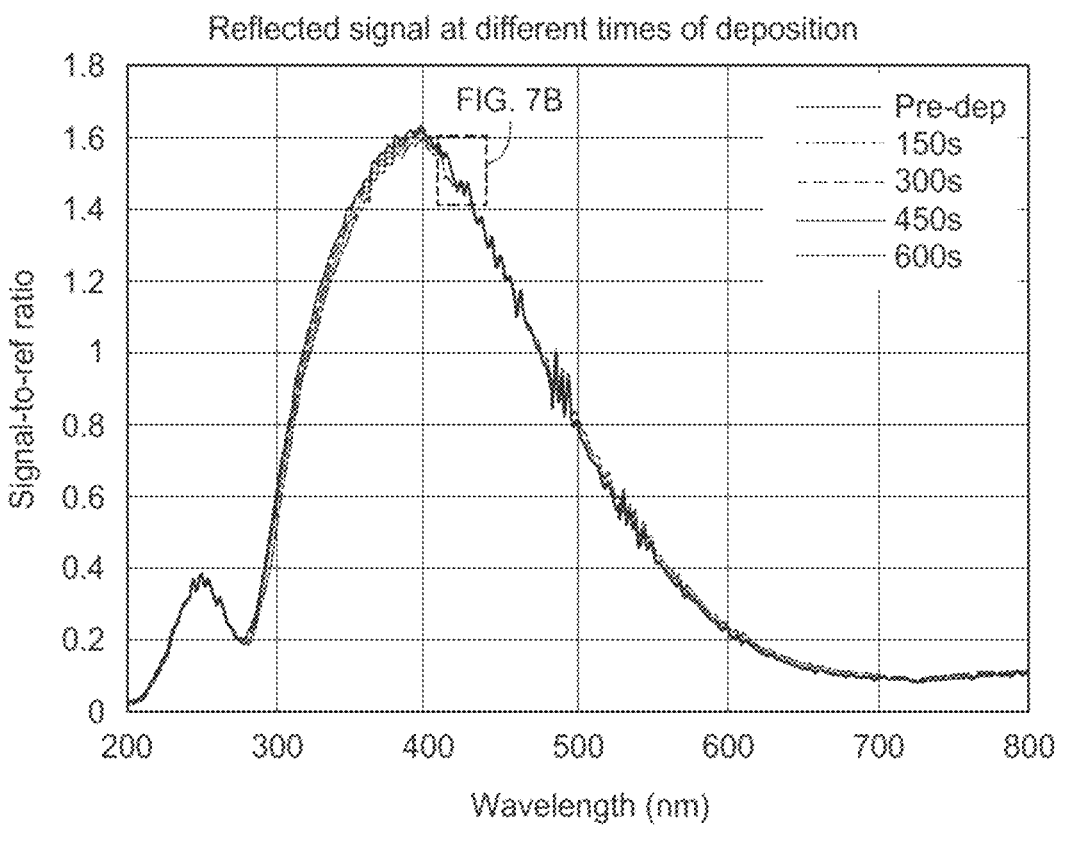
FIG. 7A illustrates a graph of a reflected signal over time during a selective deposition on a SiP wafer substrate, according to one or more implementations.
Figure 7B:
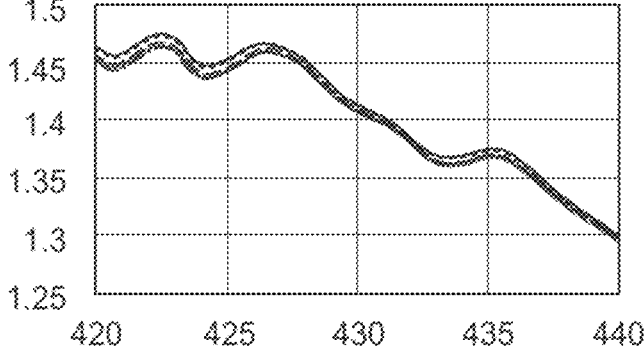
FIG. 7B illustrates a graph of the reflected signal over time during the selective deposition in a wavelength range of 420 nm to 440 nm, according to one or more implementations.
Figure 8A:
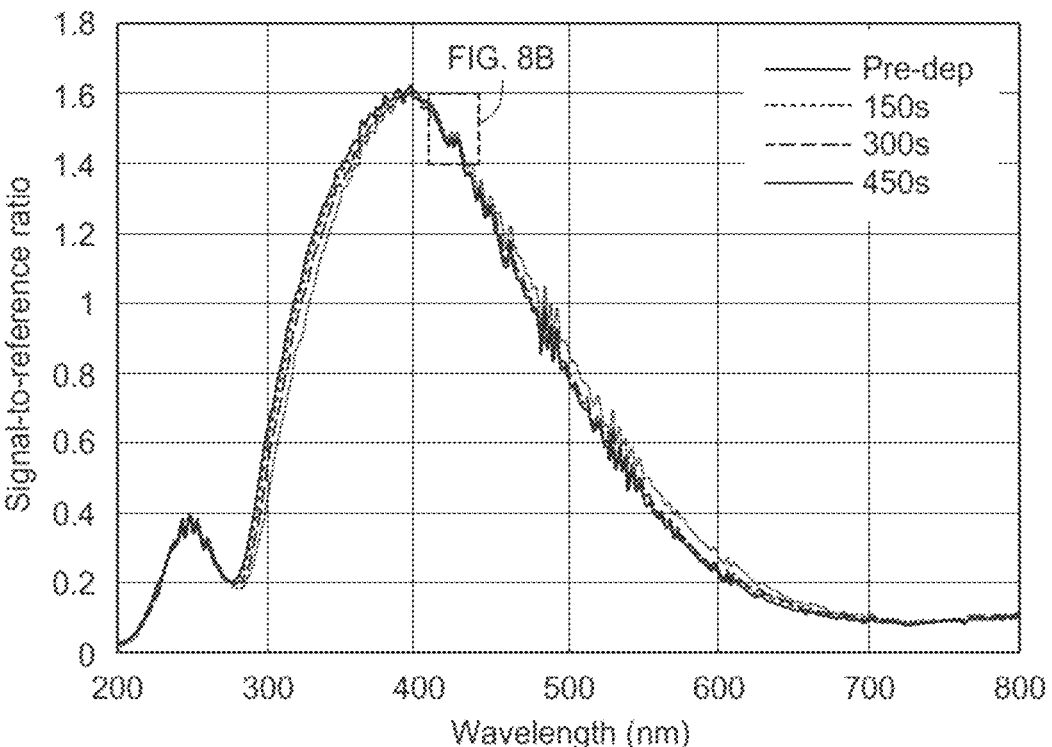
FIG. 8A illustrates a graph of the reflected signal over time during a non-selective deposition on a SiP substrate, according to one or more implementations.
Figure 8B:
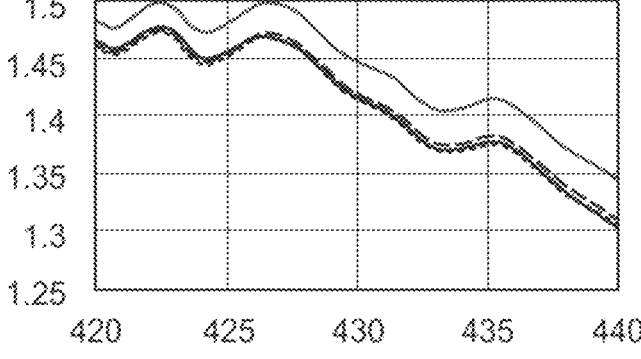
FIG. 8B illustrates a graph of the reflected signal over time during the non-selective deposition in a wavelength range of 420 nm to 440 nm, according to one or more implementations.

FIG. 7A illustrates a graph of a reflected signal over time during a selective deposition on a SiP wafer substrate. FIG. 7B illustrates a graph of the reflected signal over time during the selective deposition in a wavelength range of 420 nm to 440 nm. FIG. 8A illustrates a graph of the reflected signal over time during a non-selective deposition on a SiP substrate. FIG. 8B illustrates a graph of the reflected signal over time during the non-selective deposition in a wavelength range of 420 nm to 440 nm. In the wavelengths from about 420 nm to about 440 nm, the reflected signal intensity decreases with the selective deposition of the film material (e.g., SiP). However, in the same wavelength range, the reflected signal intensity increases for non-selective deposition, as shown by the separation of the 450 second line from the pre-deposition, 150 second, and 300 second line. The ISR system 185 is configured to detect the increase in the reflected signal to determine if the deposition of the film becomes non-selective and alter the processing conditions to shift the process back to a selective deposition.

Figure 9A:
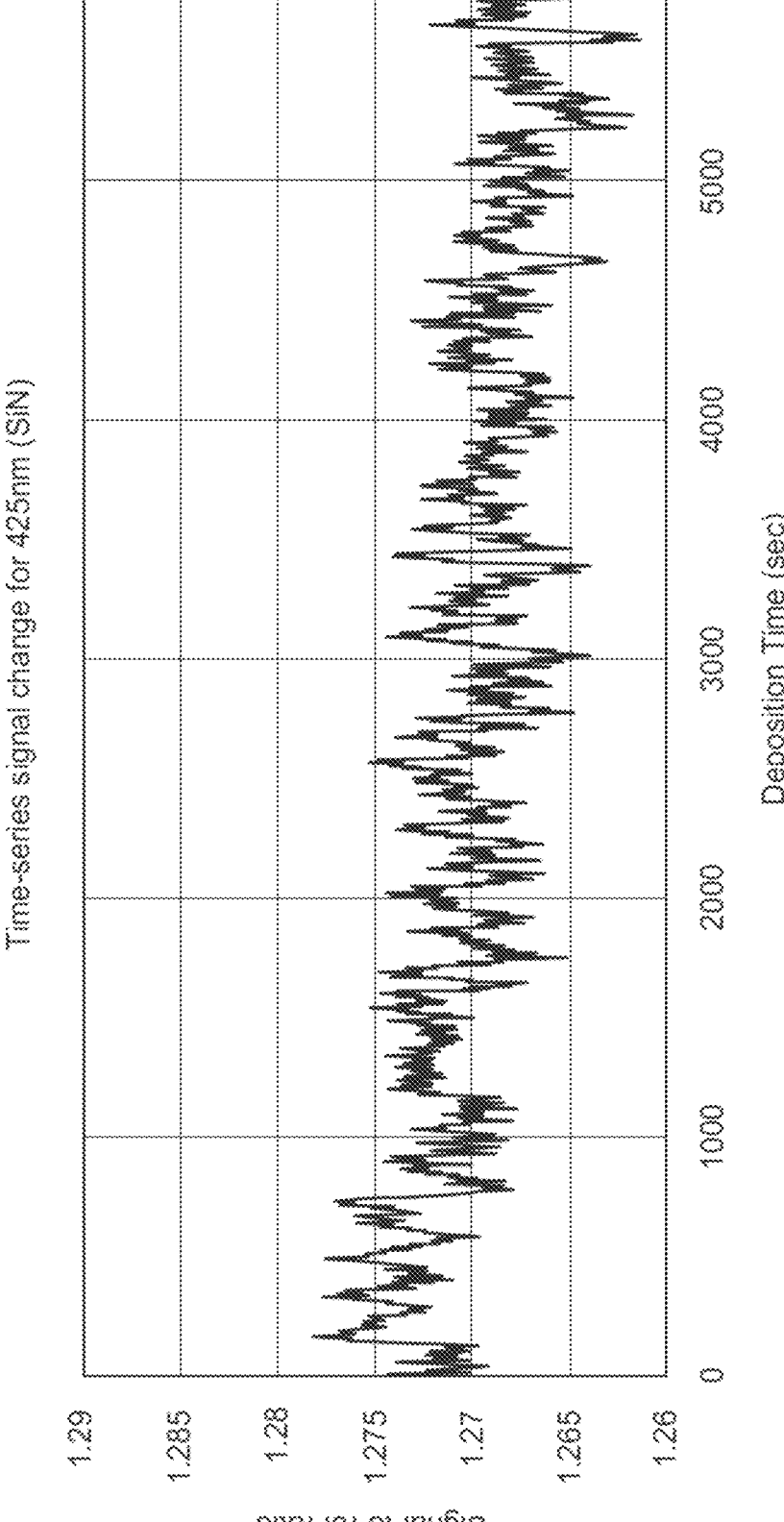
FIG. 9A illustrates a graph of the signal-to-reference ratio over time during a selective deposition on a SiN substrate, according to one or more implementations.
Figure 9B:
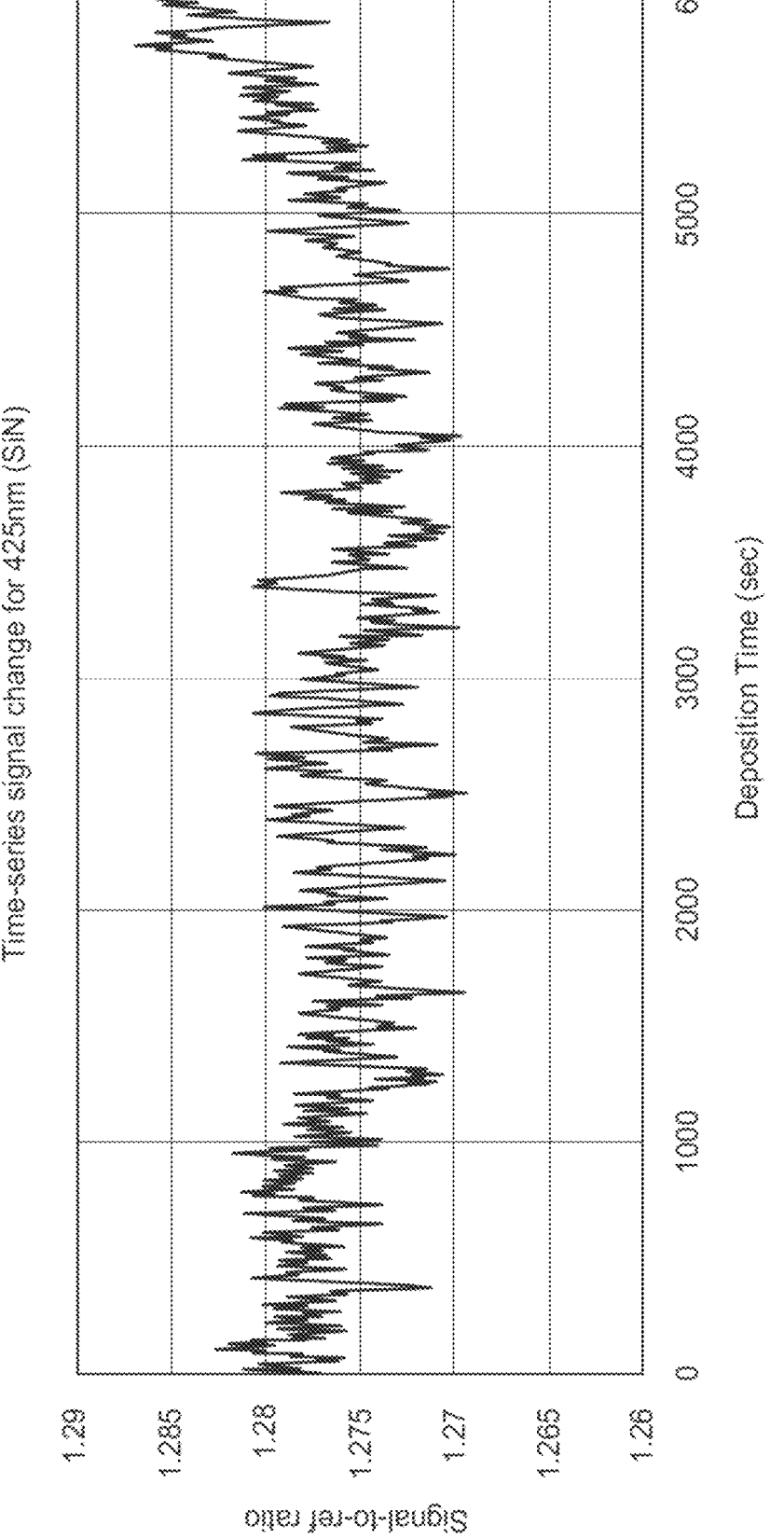
FIG. 9B illustrates a graph of the signal-to-reference ratio over time during a non-selective deposition on a SiN substrate, according to one or more implementations.

FIG. 9A illustrates a graph of the signal-to-reference ratio over time during a selective deposition on a SiN substrate. FIG. 9B illustrates a graph of the signal-to-reference ratio over time during a non-selective deposition on a SiN substrate. The signal-to-reference ratio is defined as the ratio of the reflected signal intensity to the incident light intensity. Over the course of the film deposition on the SiN substrate, the signal-to-reference ratio decreases. However, in the event that the deposition becomes non-selective, the signal-to-reference ratio will begin to increase, as shown at around 5000 seconds in FIG. 9B. The ISR system 185 is configured to detect this increase in the signal-to-reference ratio to determine if the deposition of the film becomes non-selective and alter the processing conditions to shift the process back to a selective deposition. The ISR system 185 detects the increase in the signal-to-reference ratio by determining a rate of change metric (e.g., calculating a slope) from the spectrum data received by the spectrometer. The rate of change metric is indicative of a rate of change of the intensity of the reflected beam. The film selectivity is determined to be non-selective when the rate of change metric meets a predetermined threshold value.

Benefits of the present disclosure include in-situ and real-time film selectivity measurement operations, accurate film selectivity monitoring, increased signal to noise ratios, using reduced light wavelengths, increased measurement resolutions, increased efficiency and throughput, reduced machine downtime, and reduced costs. Determining the film selectivity includes measuring a plurality of light intensity values of the reflected light across one or more time intervals. The plurality of light intensity values are correlated to reference data or physical models based on Fresnel's equations of electromagnetic wave reflection to determine the growth rate across one or more time intervals. The selectivity can correspond to a change in light intensity across the one or more time intervals. The film selectivity data can be utilized for to improve processing. For example, if the signals indicate a shift from a selective process to a non-selective process, the one or more process parameters can be adjusted to shift the process back to a selective process. The one or more process parameters can include: a flow rate of the process gas(es), a power supplied to the upper and/or lower lamps, a processing temperature of the substrate, an operational time in which the substrate processing operation is conducted, and/or a processing pressure in a process volume 110.

It is contemplated that one or more aspects disclosed herein may be combined. As an example, one or more aspects, features, components, and/or properties of the system 101, the processing chamber 100, and the ISR system 185, may be combined. Moreover, it is contemplated that one or more aspects disclosed herein may include some or all of the aforementioned benefits.

In addition to monitoring film selectivity, film growth rate, film thickness, in-film composition concentration, and temperature, it is contemplated that aspects of the present disclosure can be utilized to monitor film composition. For example, within a SiGe film, refractive index and extinction coefficient vary as a function of germanium concentration. Thus, measured changes in refractive index of extinction coefficient by sensor 245 can indicate changes in film composition during SiGe formation. Once identified, process conditions (e.g., temperature, gas flow rate, gas composition, pressure, process time, or the like) within the process chamber can be adjusted to promote a desired film composition. Iterative measurements and adjustments may be performed in order to achieve target results. While this specific example is described in relation to SiGe films, it is contemplated that aspects of the disclosure may be applied to other films of other compositions, as well.

The disclosure contemplates that terms such as "couples," "coupling," "couple," and "coupled" may include but are not limited to welding, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling. The disclosure contemplates that terms such as "couples," "coupling," "couple," and "coupled" may include operable coupling such as electric coupling and/or fluidly coupling.

The disclosure contemplates that terms such as "send," "sending," transmits," "directs," and "reflecting" light may include but are not limited to incident light, collimated light, light in an optic cable, light in an optic wire, full spectrum light, and/or light with filtered wavelengths. The disclosure contemplates that terms such as "transparent" and/or "opaque" may include but are not limited to characteristics of a material that allow light to fully and/or partially pass through.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of monitoring film selectivity on a substrate, comprising:

generating light from a light source;

collimating the light from the light source to form a collimated light beam;

directing, into a process chamber, the collimated light beam to a substrate surface during an epitaxial process;

reflecting the collimated light beam off of the substrate surface to produce a reflected beam;

receiving, by a spectrometer, the reflected beam; and analyzing data derived from the spectrometer to determine a film selectivity of the epitaxial process;

creating a calibration metric, comprising:

generating an initial data set;

performing the epitaxial process on the substrate while positioned on a susceptor assembly;

comparing the initial data set to a second data set derived from the spectrometer; and generating a third data set by comparing the initial data set to the second data set, the third data set accounting for susceptor assembly wobble.

2. The method of claim 1, further comprising modifying an epitaxial process parameter of the process chamber based on the film selectivity.

3. The method of claim 1, wherein the reflected beam is about 90° relative to the substrate surface.

4. The method of claim 1, wherein the collimated light beam follows a path located in a center of the process chamber and is directed at a center of the substrate.

5. The method of claim 1, further comprising:

comparing the data derived from a center of the substrate to data derived from a position radially outward from the center of the substrate surface; and determining the film selectivity based on the data derived from the spectrometer.

6. The method of claim 1, wherein the light from the light source is provided through a centrally-located passage in an upper housing module of the processing chamber, and the reflected beam is directed back through the centrally-located passage.

7. A method of monitoring film selectivity on a substrate, comprising:

generating light from a light source;

collimating the light from the light source to form a collimated light beam;

directing, into a process chamber, the collimated light beam to a substrate surface during an epitaxial process;

reflecting the collimated light beam off of the substrate surface to produce a reflected beam;

receiving, by a spectrometer, the reflected beam; and analyzing data derived from the spectrometer to determine a film selectivity of the epitaxial process, comprising:

determining, from the data, a rate of change metric indicative of a rate of change of an intensity of the reflected beam; and determining that the film selectivity is becoming non-selective in response to the rate of change metric meeting a threshold value.

8. The method of claim 7, further comprising:

altering processing conditions in response to determining the film selectivity of the epitaxial process.

9. The method of claim 8, wherein altering processing conditions comprises:

altering processing conditions in response to determining that the film selectivity of the epitaxial process is becoming non-selective to shift the epitaxial process back to a selective epitaxial process.

10. A processing chamber, comprising:

a susceptor assembly disposed in a processing volume of the processing chamber and configured to support a substrate;

an in-situ reflectometry (ISR) system configured to determine a film selectivity of an epitaxial process on a substrate, the ISR system comprising:

a light source configured to direct a light to a substrate surface during an epitaxial process; and a sensor configured to receive a reflected light and generate spectrum data based on the reflected light; and a controller configured to analyze the spectrum data to determine a film selectivity of the epitaxial process and modify a parameter of the epitaxial process upon determining the epitaxial process is a non-selective epitaxial process.

11. The processing chamber of claim 10, wherein the light has a wavelength of about 200 nm to about 800 nm.

12. The processing chamber of claim 11, further comprising a collimator configured to collimate the light emitted from the light source.

13. The processing chamber of claim 10, wherein the controller receives spectrum data from the sensor to determine the film selectivity.

14. The processing chamber of claim 13, wherein:

the sensor is configured to receive the reflected light throughout a duration of the epitaxial process; and the sensor generates spectrum data based on the reflected light received by the sensor.

15. A method of film selectivity monitoring, comprising:

determining a selectivity of a film formed on a substrate, comprising:

performing an epitaxial process;

directing light from a light source towards a surface of the substrate along a propagation path;

collecting a reflected light from the surface of the substrate, wherein a spectrometer receives the reflected light;

generating spectrum data based on the reflected light; and creating a data set as a reference for in-situ reflectometry from the spectrum data.

16. The method of claim 15, wherein the data set is associated with the reflected light based on variables comprising at least one of frequency, amplitude, phase shift, and fit to a function.

17. The method of claim 15, wherein the data set is generated based on the reflected light based on a physical trigger.

18. The method of claim 15, wherein the data set is associated with the reflected light based on instructions executed by a controller.

* * * * *